United States Patent
Wang

(10) Patent No.: US 6,930,348 B2
(45) Date of Patent: Aug. 16, 2005

(54) DUAL BIT SPLIT GATE FLASH MEMORY

(75) Inventor: Shih-Wei Wang, Hsin-Chu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 28 days.

(21) Appl. No.: 10/602,229

(22) Filed: Jun. 24, 2003

(65) Prior Publication Data

US 2004/0262668 A1 Dec. 30, 2004

(51) Int. Cl.[7] .................................................. H01L 29/788
(52) U.S. Cl. ..................... 257/315; 257/314; 257/316; 257/320; 257/321; 257/322
(58) Field of Search ..................... 257/239, 261, 257/298, 315–326

(56) References Cited

U.S. PATENT DOCUMENTS

| | | | | |
|---|---|---|---|---|
| 5,278,439 A | * | 1/1994 | Ma et al. | 257/319 |
| 5,494,838 A | * | 2/1996 | Chang et al. | 438/264 |
| 6,040,602 A | * | 3/2000 | Fulford et al. | 257/344 |
| 6,133,098 A | | 10/2000 | Ogura et al. | |
| 6,151,248 A | | 11/2000 | Harari et al. | |
| 6,232,180 B1 | * | 5/2001 | Chen | 438/257 |
| 6,266,678 B1 | | 7/2001 | McDevitt et al. | |
| 6,281,545 B1 | * | 8/2001 | Liang et al. | 257/315 |
| 6,344,993 B1 | | 2/2002 | Harari et al. | |
| 6,359,807 B1 | | 3/2002 | Ogura et al. | |
| 6,366,500 B1 | | 4/2002 | Ogura et al. | |
| 6,462,375 B1 | | 10/2002 | Wu | |
| 6,563,166 B1 | * | 5/2003 | Ni | 257/316 |

* cited by examiner

*Primary Examiner*—Andy Huynh
(74) *Attorney, Agent, or Firm*—Thomas, Kayden, Horstemeyer & Risley

(57) ABSTRACT

The dual bit split gate flash memory of the invention comprises a plurality of memory cells wherein each memory cell comprises a select gate overlying a substrate and isolated from the substrate by a select gate oxide layer, a first and second floating gate on opposite sidewalls of the select gate and isolated from the select gate by an oxide spacer, and a control gate overlying the select gate and the first and second floating gates and isolated from the select gate and the first and second floating gates by a dielectric layer, and source and drain regions within the substrate and shared by adjacent memory cells.

10 Claims, 5 Drawing Sheets

DUAL BIT SPLIT GATE FLASH MEMORY

BACKGROUND OF THE INVENTION (1) Field of the Invention

The present invention relates to the fabrication of integrated circuit devices, and more particularly, to the fabrication of a dual bit flash memory having increased bit density over a single bit flash memory, but without the disadvantages of multi-level cell technology.

(2) Description of the Prior Art

Improvements in Flash memory devices are sought continuously. One area of desired improvement is in bit density. One way to increase bit density in flash memory is to adopt a multi-level cell technology. The multi-level cells store fractional levels of charge within a cell to provide increased data storage capability. This means that each of the levels requires a precisely metered number of electrons to be stored in the floating gate and each of the levels has its own threshold voltage (Vt) margin. As a result, program operation needs to be performed carefully and is inherently slow in comparison with conventional single bit technology program operation. Furthermore, multi-level cell devices generally much use higher operating voltages to ensure a Vt window wide enough to accommodate all levels. The associated high fields result in oxide wear-out and limit the endurance of the device. It is desired to increase bit density without resorting to multi-level cell technology.

U.S. Pat. No. 6,462,375 to Wu et al discloses two floating gates having a shared select gate/control gate therebetween. U.S. Pat. Nos. 6,151,248, 6,344,993 and 6,266,278 to Harari et al show floating gates on the sidewalls of a select gate. U.S. Pat. Nos. 6,133,098, 6,366,500, and 6,359,807 to Ogura et al describe two floating gates on the sidewalls of a select gate wherein a control gate separates each set of select gate/floating gates.

SUMMARY OF THE INVENTION

Accordingly, it is a primary object of the invention to provide a method for fabricating a flash memory having increased bit density in the fabrication of integrated circuits.

Another object of the invention is to provide a dual bit split gate flash memory having two floating gates separated by a select gate, all underlying a control gate.

A further object is to provide a method of fabricating a split gate flash memory having increased bit density.

A still further object is to provide a method of fabricating a dual bit split gate flash memory.

Yet another object is to provide a method of fabricating a dual bit split gate flash memory having two floating gates separated by a select gate, all underlying a control gate.

In accordance with the objects of the invention, a method of fabricating a dual bit split gate flash memory is achieved. A select gate oxide layer is provided on the surface of a substrate. A first polysilicon layer is deposited overlying the select gate oxide layer. A a capping layer is deposited overlying the first polysilicon layer. The capping layer, first polysilicon layer, and select gate layer are patterned to form a plurality of select gates. Spacers are formed on sidewalls of the select gates. A tunneling oxide layer is grown on the substrate exposed between the select gates. A second polysilicon layer is deposited overlying the tunneling oxide layer and the select gates and etched back below a top surface of the select gates. An interpoly dielectric layer is deposited overlying the second polysilicon layer and the select gates. A third polysilicon layer is deposited overlying the interpoly dielectric layer. A capping oxide layer is deposited overlying the third polysilicon layer. The capping oxide layer, third polysilicon layer, and second polysilicon layer are patterned to form a plurality of memory cells wherein a portion of the second polysilicon layer remains on either side of each of the select gates forming first and second floating gates for each memory cell and wherein the third polysilicon layer covers the select gate and the first and second floating gate of each memory cell and forms a control gate. Ions are implanted to form source and drain regions within the substrate between memory cells wherein the source and drain regions are shared by adjacent memory cells to complete fabrication of a dual-bit split gate flash memory.

Also in accordance with the objects of the invention, a dual bit split gate flash memory is achieved. The dual bit split gate flash memory comprises a plurality of memory cells wherein each memory cell comprises a select gate overlying a substrate and isolated from the substrate by a select gate oxide layer, a first and second floating gate on opposite sidewalls of the select gate and isolated from the select gate by an oxide spacer, and a control gate overlying the select gate and the first and second floating gates and isolated from the select gate and the first and second floating gates by a dielectric layer, and source and drain regions within the substrate and shared by adjacent memory cells.

BRIEF DESCRIPTION OF THE DRAWINGS

In the accompanying drawings forming a material part of this description, there is shown.

DESCRIPTION OF THE PREFERRED EMBODIMENTS

The process of the present invention provides a dual bit split gate flash memory and a method of making the same. Each memory cell possesses two floating gates having very short channel lengths and separated by a select gate under a single control gate. Each cell can store electrons into the two separated floating gates independently by source-side injection and erase them by Fowler-Nordheim tunneling. The data in each bit is selected by the source/drain bit line and reverse read independently.

Figure 1:
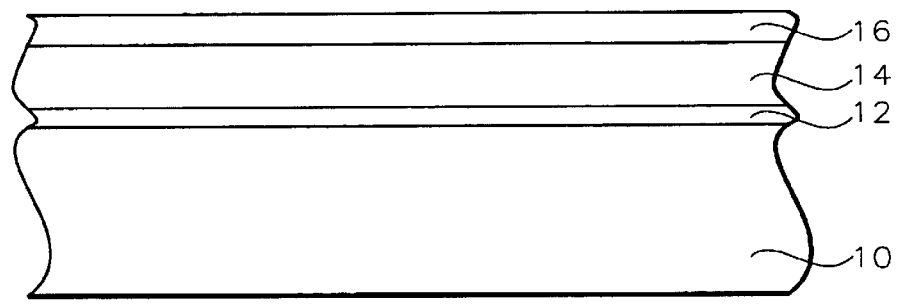
FIGS. 1–6 are a cross-sectional representations of a preferred embodiment of the process of the present invention.

The process of the present invention begins with a preferably doped semiconductor substrate 10, illustrated in FIG. 1. Now a gate stack is formed. First a thin oxide layer is formed. This will be the select gate oxide 12, formed by deposition or thermal oxidation on the surface of the substrate to a thickness of between about 29 and 35 Angstroms. Now, a first polysilicon layer 14 is deposited on the oxide layer 12, such as by low pressure chemical vapor deposition (LPCVD), to a thickness of between about 1000 and 1200

Angstroms. Now, a capping oxide layer 16 is formed such as by high temperature oxide (HTO) having a thickness of between about 800 and 1000 Angstroms.

Figure 2:
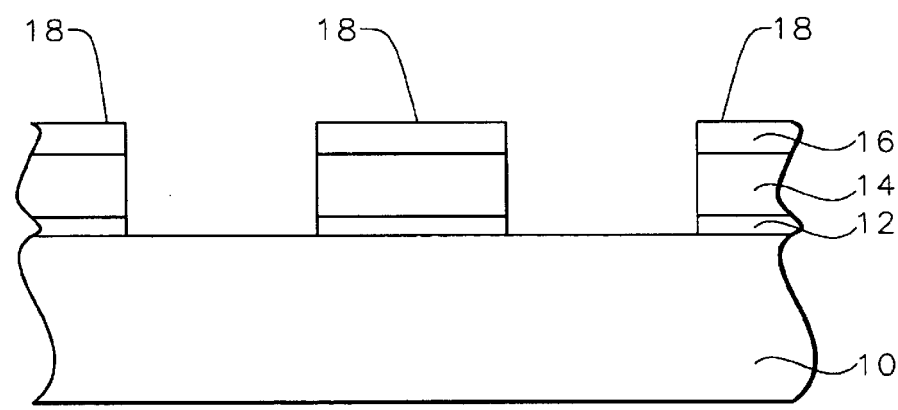
Figure 3:
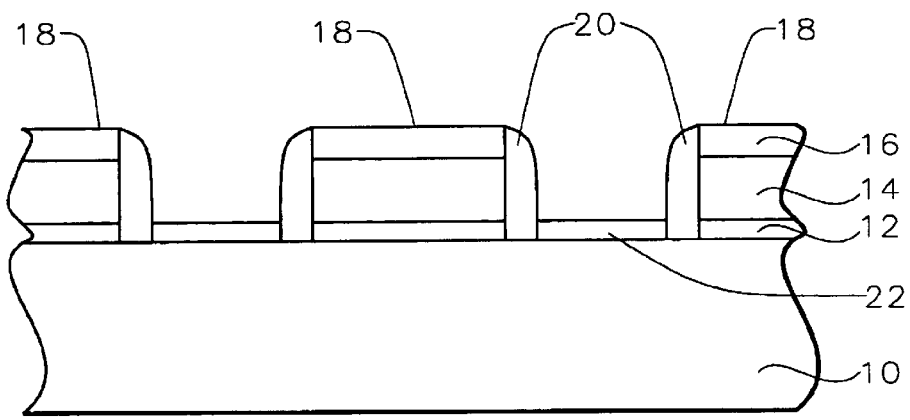

Referring now to FIG. 2, the gate stack is patterned to form select gates 18 having gaps therebetween. Next, a second HTO deposition is performed overlying the select gates. The HTO layer is anisotropically etched to leave HTO spacers 20 on the sidewalls of the select gates, as shown in FIG. 3. The HTO spacers 20 have a width of between about 400 and 500 Angstroms. A tunneling oxide layer 22 is grown on the exposed substrate 10 between the select gates, as shown. The tunneling oxide layer 22 has a thickness of between about 80 and 100 Angstroms.

Figure 4:
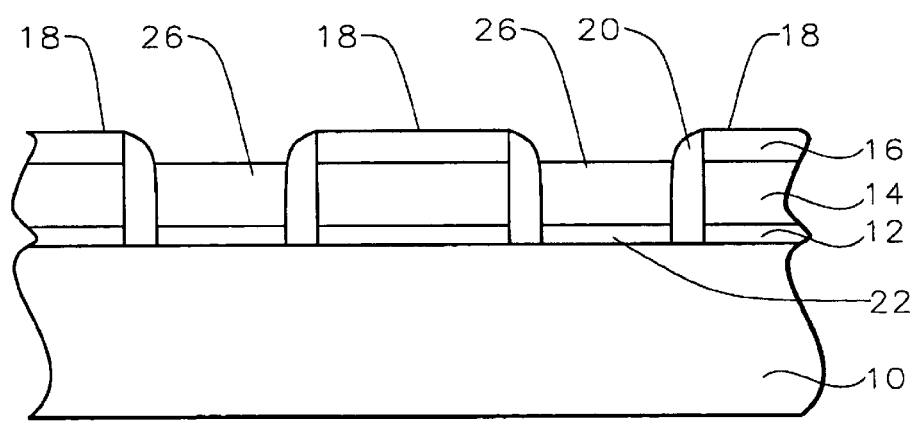

Referring now to FIG. 4, a second thick polysilicon layer is deposited to fill the gaps between the select gates. The polysilicon layer should have a thickness of between about 2000 and 2500 Angstroms. The second polysilicon layer is then etched back or polished back using chemical mechanical polishing (CMP), for example, to below the surface of the HTO capping layer 18 on the select gates. This separates and self-aligns the polysilicon 26 along the select gates. The resulting polysilicon layer 26 should have a thickness of between about 1300 and 1600 Angstroms.

Figure 5:
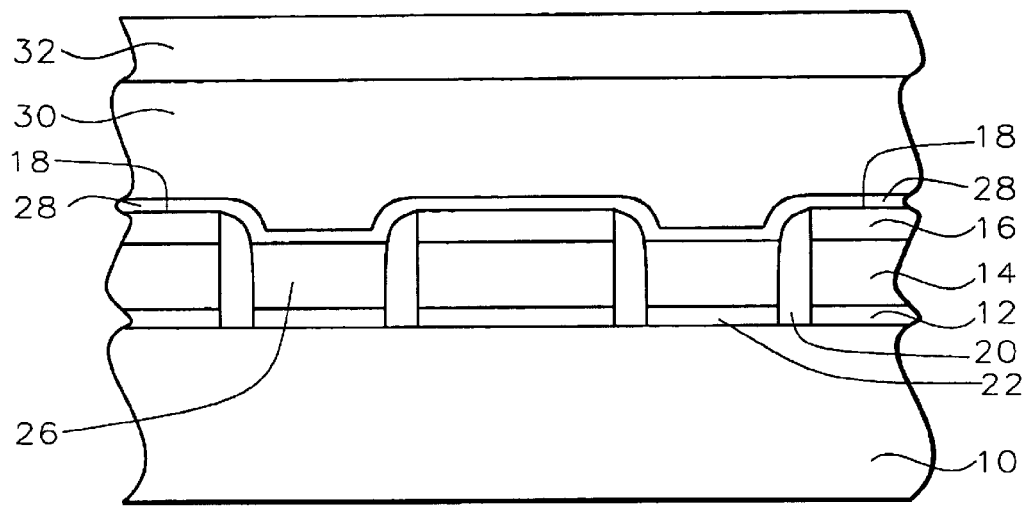

Referring now to FIG. 5, an interpoly dielectric layer 28 is formed. For example, this may be an ONO layer comprising a HTO oxide layer, a silicon nitride layer, and a HTO oxide layer, each having a thickness of between about 60 and 70 Angstroms, deposited in sequence. A third polysilicon layer 30 is deposited on the ONO layer 28 to a thickness of between about 2000 and 2400 Angstroms. A capping layer 32 of tetraethoxysilane (TEOS) oxide, for example, is deposited over the third polysilicon layer to a thickness of between about 1000 and 1300 Angstroms.

Figure 6:
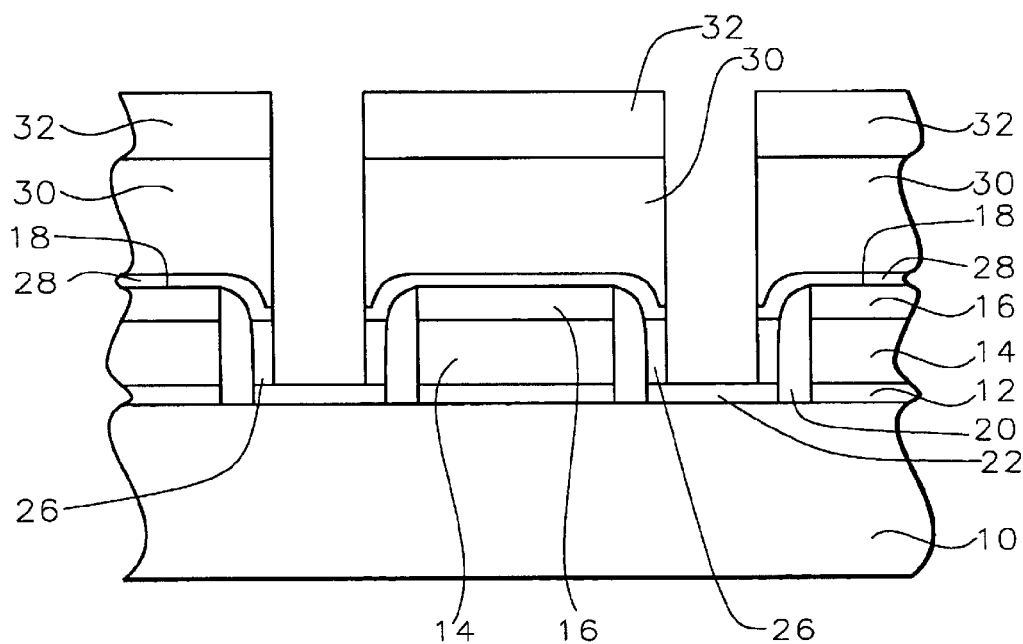

The stack of second polysilicon, ONO, third polysilicon, and TEOS cap is patterned aligning with the select gate pattern. The critical dimension (CD) of the stack covers the first polysilicon CD, the spacer width of the two HTO spacers, and the minimum overlay tolerance. FIG. 6 shows the resulting devices. The second polysilicon layer 26 remaining on the sidewalls of the HTO spacers 20 forms floating gates on either side of the select gate 16. The floating gates each have a thickness of between about 1300 and 1600 Angstroms and a length of between about 500 and 700 Angstroms, for example. The third polysilicon layer remaining 30 forms a single control gate overlying the select gate and two floating gates.

Figure 7:
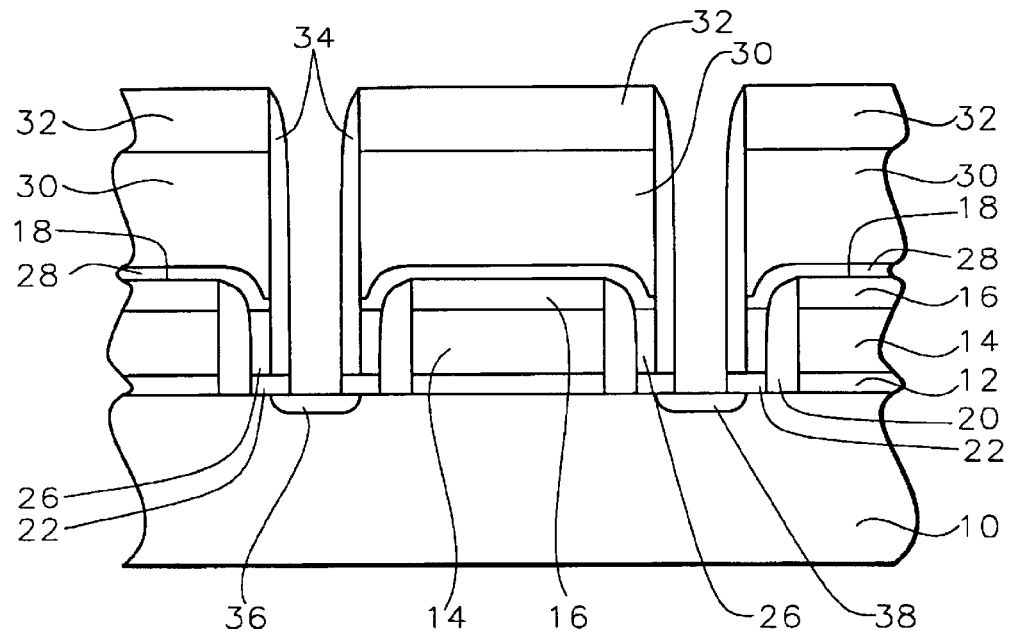
FIG. 7 is a cross-sectional representation of the dual bit split gate flash memory of the present invention.

Now a spacer dielectric layer 34 is formed on the sidewalls of the stack pattern for isolation, as shown in FIG. 7. This dielectric layer may comprise HTO, TEOS oxide, or a composite film such as HTO/SiN/HTO. The spacers 34 will have a width of between about 400 and 500 Angstroms. The drain 36 and source 38 are implanted self-aligned to the control gate electrodes 30. LDD regions, not shown, are formed before formation of the spacers 34.

This completes fabrication of the dual bit split gate flash memory of the present invention. Each memory cell possesses two floating gates 26. These act as two virtual transistors to increase the density of the memory bit. Each of these floating gates can be read, erased, and programed independently of each other and at full power. The floating gates have a very short channel length. For example, in 0.18 technology, the channel length is between about 0.05 and 0.07 m. The floating gates 26 are separated by a select gate 16 under a single control gate 30. Drain and source regions 36 and 38, respectively, lie within the semiconductor substrate on either side of the memory cell and are shared with adjacent memory cells.

DEVICE OPERATION

Figure 8:
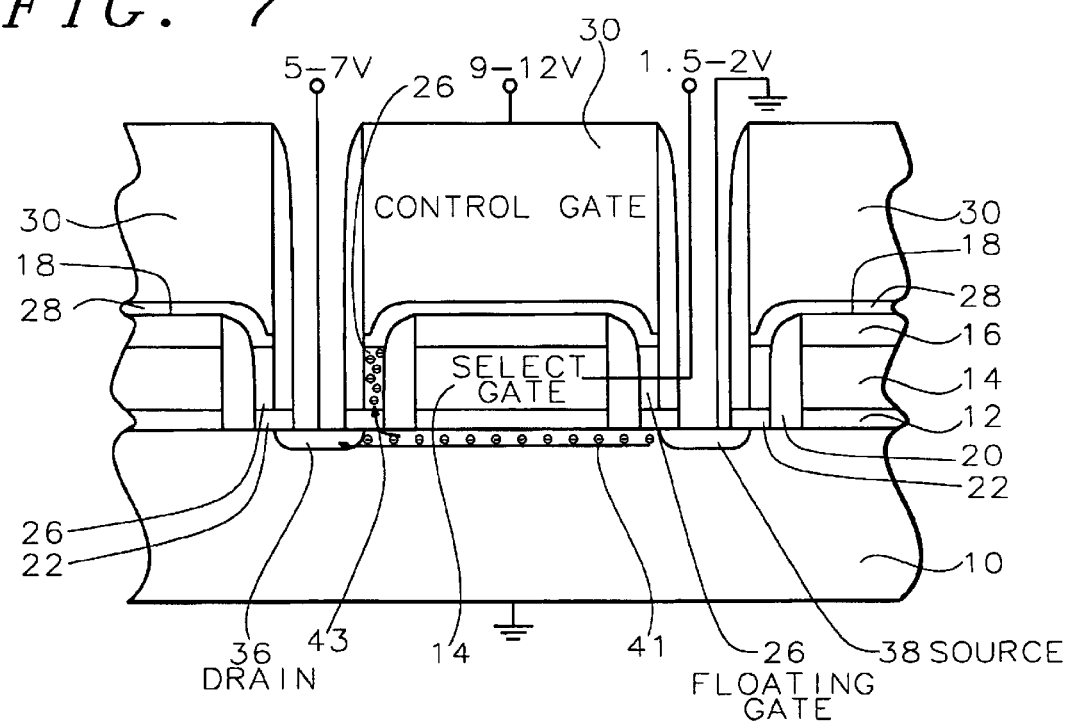
FIG. 8 is a cross-sectional representation of the dual bit split gate flash memory of the present invention showing programming operation.

The flash memory cell of the present invention can store electrons into the two separated floating gates independently by source-side hot electron injection. Programming of the drain side bit by source-side hot electron injection is illustrated in FIG. 8.

The TEOS capping layer has been removed and the control gate electrode electrically connected, for example, through a polysilicon via, not shown in this view. The voltages shown are typical values. For example, a select gate voltage of between about 1.5 and 2 volts is applied, a control gate voltage of between about 9 and 12 volts is applied, and a drain voltage of between about 5 and 7 volts is applied for a duration of more than about 5 microseconds per bit.

The select gate voltage is applied to the select gate 16. The control gate voltage is applied to the control gate 30 and the drain voltage is applied to the drain 36. The source and the substrate are connected to ground, as shown. Hot electrons are injected from the source to the drain side and into the floating gate bit 26, as shown by arrows 41 and 43.

Figure 9:
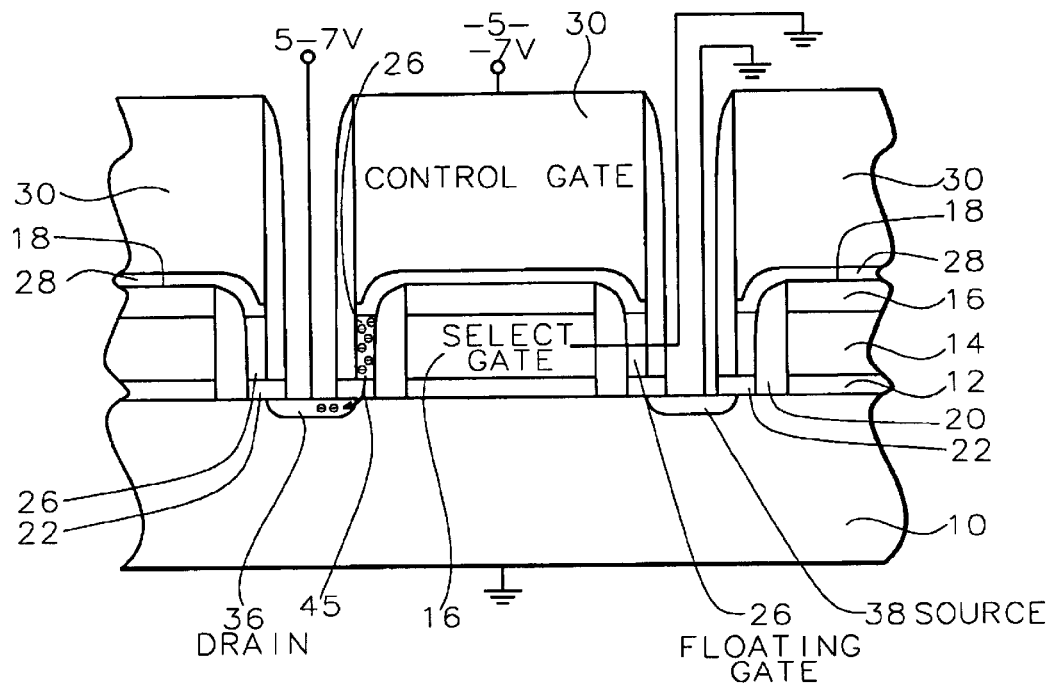
FIG. 9 is a cross-sectional representation of the dual bit split gate flash memory of the present invention showing erasing operation.

The flash memory cell of the present invention is erased by Fowler-Nordheim tunneling of electrons from the floating gate to the drain or source. The erasing of the drain-side bit is shown in FIG. 9. The voltages shown are typical values. For example, a negative bias control gate voltage of between about −5 and −7 volts is applied and a positive bias of the drain voltage of between about 5 and 7 volts is applied for a duration of more than about 5 milliseconds per bit. The control gate voltage is applied to the control gate 30 and the drain voltage is applied to the drain 36. The source 38 and the substrate 10 are connected to ground, as shown. Tunneling of electrons 45 from the drain-side floating gate bit 26 to the drain 36, shown by arrow 45, erases the information in the floating gate bit 26.

Figure 10:
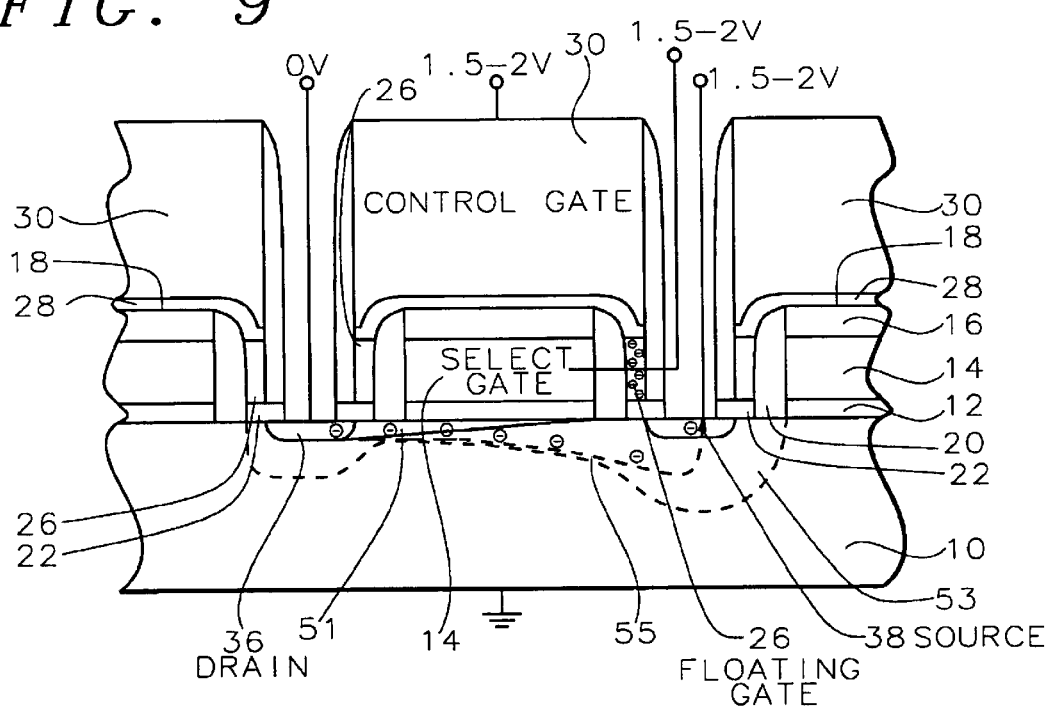
FIG. 10 is a cross-sectional representation of the dual bit split gate flash memory of the present invention showing reading operation.

The data in each bit is selected by the source/drain bit line and reverse read independently. FIG. 10 illustrates the reverse read mechanism to read the drain-side bit. The channel under the unselected bit (the source-side bit in the illustrated case) is forced into conductive depletion. The whole channel impedance will depend on the threshold voltage of the selected bit. Thus, the bit state of the unselected bit does not affect reading of the selected bit. The voltages shown are typical values. For example, a control gate voltage of between about 1.5 and 2 volts is applied, a select gate voltage of between about 1.5 and 2 volts is applied, a source voltage of between about 1.5 and 2 volts is applied, and the drain voltage is set to 0. The select gate voltage is applied to the select gate 16. The control gate voltage is applied to the control gate 30 and the source voltage is applied to the source 38. A zero voltage is applied to the drain 36. The substrate is connected to ground, as shown. The channel under the source-side bit is forced into conductive depletion. The depletion region 53 is illustrated. The inversion region 51 is the channel formed by the inversion carriers. Arrow 55 shows the electrons being swept across the depletion region toward the source.

The process of the present invention provides a novel dual-bit split gate architecture wherein each memory cell holds two virtual transistors to increase the density of the memory bit. Each of the bits can be read, erased, and programed independently of the other and at full power. The Vt margins of each bit are the same as that in single bit flash memories regardless of the select gate Vt. The operation speed and endurance are superior to those in multi-level cells. The minimum cell channel length (under the two floating gates and one select gate) depends only on lithography resolution and overlay tolerance, so can be shrunken easily.

While the invention has been particularly shown and described with reference to the preferred embodiments thereof, it will be understood by those skilled in the art that various changes in form and details may be made without departing from the spirit and scope of the invention.

What is claimed is:

1. A dual-bit split gate flash memory comprising:
   a plurality of memory cells wherein each memory cell comprises:
      a select gate overlying a substrate and isolated from said substrate by a select gate oxide layer;
      a first and second floating gate on opposite sidewalls of said select gate and isolated from said select gate by an oxide spacer; and
      a control gate overlying said select gate and said first and second floating gates and isolated from said select gate and said first and second floating gates by a dielectric layers; and
   source and drain regions within said substrate and shared by adjacent said memory cells.

2. The memory according to claim 1 wherein a channel length under said select gate and said first and second floating gates in between about 0.05 and 0.07 microns in 0.18 micron technology.

3. The memory according to claim 1 wherein said select gate comprises:
   a polysilicon layer having a thickness of between about 1000 and 1200 Angstroms; and
   a dielectric capping layer having a thickness of between about 800 and 1000 Angstroms.

4. The memory according to claim 3 wherein said dielectric capping layer comprises high temperature oxide.

5. The memory according to claim 1 wherein said select gate oxide has a thickness of between about 29 and 35 Angstroms.

6. The memory according to claim 1 wherein said oxide spacer comprises high temperature oxide and has a width of between about 400 and 500 Angstroms.

7. The memory according to claim 1 wherein first and second floating gates are isolated from said substrate by a tunneling oxide having a thickness of between about 80 and 100 Angstroms.

8. The memory according to claim 1 wherein said first and second floating gates have a thickness of between about 1300 and 1600 Angstroms and a length of between about 500 and 700 Angstroms.

9. The memory according to claim 1 wherein said control gate comprises polysilicon having a thickness of between about 2000 and 2400 Angstroms.

10. The memory according to claim 1 wherein said dielectric layer comprises a first layer of high temperature oxide, a second layer of silicon nitride, and a third layer of high temperature oxide, each layer having a thickness of between about 60 and 70 Angstroms.

* * * * *